(12) United States Patent
Fu et al.

(10) Patent No.: US 12,107,075 B2
(45) Date of Patent: Oct. 1, 2024

(54) HYBRID BONDED INTERCONNECT BRIDGING

(71) Applicant: ADVANCED MICRO DEVICES, INC., Santa Clara, CA (US)

(72) Inventors: Lei Fu, Austin, TX (US); Brett P. Wilkerson, Austin, TX (US); Rahul Agarwal, Livermore, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 18/324,744

(22) Filed: May 26, 2023

(65) Prior Publication Data
US 2023/0387076 A1  Nov. 30, 2023

Related U.S. Application Data

(63) Continuation of application No. 17/003,113, filed on Aug. 26, 2020, now Pat. No. 11,676,940.

(60) Provisional application No. 63/064,662, filed on Aug. 12, 2020.

(51) Int. Cl.
*H01L 25/065* (2023.01)
*H01L 23/00* (2006.01)
*H01L 23/538* (2006.01)

(52) U.S. Cl.
CPC ...... *H01L 25/0655* (2013.01); *H01L 23/5381* (2013.01); *H01L 23/5389* (2013.01); *H01L 24/13* (2013.01); *H01L 2225/06541* (2013.01)

(58) Field of Classification Search
CPC .................................................. H01L 25/0655
See application file for complete search history.

(56) References Cited

U.S. PATENT DOCUMENTS

| | | |
|---|---|---|
| 8,431,436 B1 | 4/2013 | Nguyen |
| 2018/0297143 A1 | 10/2018 | Imbert et al. |
| 2019/0198445 A1* | 6/2019 | Alur ............... H01L 21/4853 |
| 2020/0176384 A1 | 6/2020 | Wu et al. |

* cited by examiner

*Primary Examiner* — William A Harriston

(57) ABSTRACT

A chip for hybrid bonded interconnect bridging for chiplet integration, the chip comprising: a first chiplet; a second chiplet; an interconnecting die coupled to the first chiplet and the second chiplet through a hybrid bond.

20 Claims, 9 Drawing Sheets

210

215

220

225

230

235

240

245

HYBRID BONDED INTERCONNECT BRIDGING

CROSS-REFERENCE TO RELATED APPLICATION

This application is a continuation application for patent entitled to a filing date and claiming the benefit of earlier-filed U.S. Pat. No. 11,676,940, issued Jun. 13, 2023, which claims priority to U.S. Provisional Patent Application No. 63/064,662, filed Aug. 12, 2020. Each patent application cited herewith is hereby incorporated by reference in its entirety.

BACKGROUND

High performance integration of chiplets require fine pitch, high bandwidth connections between chiplets. Though bridges or interconnecting dies can be used to connect chiplets, existing solutions require a connection pitches of greater than 25 micrometers.

DETAILED DESCRIPTION

Figure 1A:
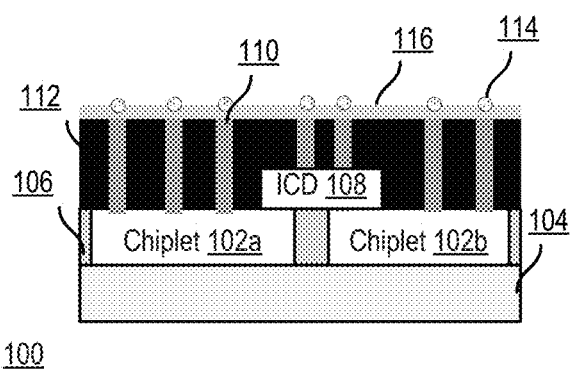
FIG. 1A is a block diagram of an example chip for hybrid bonded interconnect bridging according to some embodiments.

In some embodiments, a chip for hybrid bonded interconnect bridging includes: a first chiplet; a second chiplet; and an interconnect die coupled to the first chiplet and the second chiplet through a hybrid bond.

In some embodiments, the hybrid bond comprises an oxide bond and a copper bond. In some embodiments, the interconnect die comprises one or more trans-silicon via (TSV) connections between the first chiplet and the second chiplet. In some embodiments, the interconnect die includes one or more physical intellectual property blocks facilitating communication external to the interconnect die. In some embodiments, the chip further includes an epoxy molding layer, one or more conductive pillars coupled to the first chiplet or the second chiplet, and one or more conductive bumps applied to the one or more conductive pillars. In some embodiments, the chip further includes a fluorosilicate glass (FSG) dielectric layer and one or more through-dielectric vias coupled to the first chiplet or the second chiplet. The chip of claim 1, the dielectric layer comprises fluorosilicate glass (FSG). In some embodiments, the chip further includes another interconnecting die bonded to one or more other chiplets using another hybrid bond.

In some embodiments, an apparatus for hybrid bonded interconnect bridging includes: a chip including: a first chiplet; a second chiplet; and an interconnect die coupled to the first chiplet and the second chiplet through a hybrid bond.

In some embodiments, the hybrid bond comprises an oxide bond and a copper bond. In some embodiments, the interconnect die comprises one or more trans-silicon via (TSV) connections between the first chiplet and the second chiplet. In some embodiments, the interconnect die includes one or more physical intellectual property blocks facilitating communication external to the interconnect die. In some embodiments, the chip further includes an epoxy molding layer, one or more conductive pillars coupled to the first chiplet or the second chiplet, and one or more conductive bumps applied to the one or more conductive pillars. In some embodiments, the chip further includes a fluorosilicate glass (FSG) dielectric layer and one or more through-dielectric vias coupled to the first chiplet or the second chiplet. The chip of claim 1, the dielectric layer comprises fluorosilicate glass (FSG). In some embodiments, the chip further includes another interconnecting die bonded to one or more other chiplets using another hybrid bond.

In some embodiments, a method of hybrid bonded interconnect bridging for chiplet integration includes: bonding an interconnecting die to a first chiplet and a second chiplet using a hybrid bond.

In some embodiments, the hybrid bond includes an oxide bond and a copper bond. In some embodiments, the interconnecting die includes one or more trans-silicon via (TSV) connections between the first chiplet and the second chiplet. In some embodiments, the interconnecting die includes one or more physical intellectual property blocks facilitating communication external to the interconnecting die. In some embodiments, the method further includes: coupling one or more conductive pillars to the first chiplet and the second chiplet; applying an epoxy molding layer to the first chiplet and the second chiplet; and applying one or more conductive bumps to the one or more conductive pillars. In some embodiments, the method further includes applying, to the first chiplet and the second chiplet, a dielectric layer includes one or more through-dielectric vias coupled to the first chiplet or the second chiplet. In some embodiments, the dielectric layer comprises fluorosilicate glass (FSG). In some embodiments, the method further includes bonding another interconnecting die to one or more other chiplets using another hybrid bond.

FIG. 1A is a block diagram of a non-limiting example chip 100. The example chip 100 can be implemented in a variety of computing devices, including mobile devices, personal computers, peripheral hardware components, gaming devices, set-top boxes, and the like. The chip 100 includes chiplets 102a and 102b. Each of the chiplets 102a,b is a functional circuit block designed to integrate with other chiplets 102a,b. Each chiplet 102a,b includes, for example, a silicon die or a stack of multiple silicon dies. The chiplets 102a,b are bonded to a wafer 104. The wafer 104 provides a substrate or surface for the placement and reconstituting of the chiplets 102a,b in the chip 100. The wafer 104 may be implemented with various grades. In some embodiments, for example, the wafer 104 may be implemented with a dummy grade silicon wafer 104 In other implementations, the wafer 104 may be implemented with any of a prime grade, test grade, or reclaimed wafer. The chiplets 102a,b are layered in a deposition 106 such as an oxide/nitride deposition 106, polycrystalline silicon, silicon nitride or another thin film, inorganic dielectric. The deposition 106 serves to fill areas around the chiplets 102a,b such that the deposition 106 and chiplets 102a,b form a coplanar layer of the chip.

The chiplets 102a,b are connected using an interconnecting die (ICD) 108. The interconnecting die 108, or "bridge," is a silicon die that provides a connective coupling between two or more chiplets. In other words, a connection path between two chiplets is formed using the interconnecting dies and interconnects between the layers of the formed chip 100. Particularly, the interconnecting dies 108 provide input/output paths between connection points on the chiplets 102a/b, allowing for signal transfer between the chiplets 102a/b via the interconnecting dies 108. Existing bridge-related solutions (e.g., Embedded Multi-die Interconnect Bridge (EMIB), Omni-Directional Interconnect (ODI), 2.5D fanouts, Wafer-Level Fan Out (WLFO)) require connection pitches of greater than 25 micrometers. As described herein, a "connection" is an input/output communications pathway between components. "Pitch" refers to the center-of-line to center-of-line distance between adjacent connection pathways. As connection pitches are reduced, more connection pathways in a given surface area of the chiplet 102a,b are possible, allowing for increased communications bandwidth through the greater number of connection pathways, Existing bridge-related solutions do not provide finer pitches and thus would not provide the greater bandwidth of a finer pitch embodiment.

The example interconnecting die 108 of FIG. 1A, by contrast, provides finer pitch connection pathways than those of the existing solutions. The example interconnecting die 108 is finer pitched by being bonded directly to the chiplets 102a,b using a hybrid bond. As described herein, a "bond" is a type of interconnect (e.g., chemical, metallic, etc.) between connection points of components and/or between the surfaces of components. A hybrid bond as the term is used here refers to a modified version of a traditional wafer-level bonding. More specifically, the hybrid bond is contrasted with thermocompression bonding. Thermocompression bonding is a wafer bonding process in which two metals are brought into atomic contact applying force and heat simultaneously. Wafer bonding generally is a packaging process at wafer-level that ensures a mechanically stable and hermetically sealed encapsulation of the wafer. In contrast to wafer-level bonding that ensures stable, sealed encapsulation of a wafer, the example interconnecting die 108 is bonded to the chiplets 102a, b directly. Further, the hybrid bond is formed of one metal and a dielectric rather than two metals like thermocompression bonding. Such a direct bonding of an interconnecting die 108 to one or more chiplets formed of a metal-dielectric pairing is referred to here and throughout as a hybrid bond. Examples of metal interconnects in the hybrid bond include copper, indium, and silver. As an example, the hybrid bond used in the chip 100 to connect the interconnecting die 108 to the chiplets 102a,b includes a copper bond and an oxide bond (e.g., a copper-oxide bond), a copper bond and a silicon-oxide bond, or another combination of metallic interconnects and another dielectric bond. For example, a dielectric bond (e.g., oxide bond) can be formed between two components at room temperature. When heat is applied, the metal interconnects of each component expand and bond with the aligned metal interconnects of the other component.

Figure 1B:
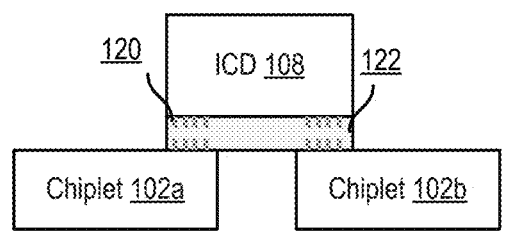
FIG. 1B is a diagram of an example stage of a hybrid bond for hybrid bonded interconnect bridging according to some embodiments.
Figure 1C:
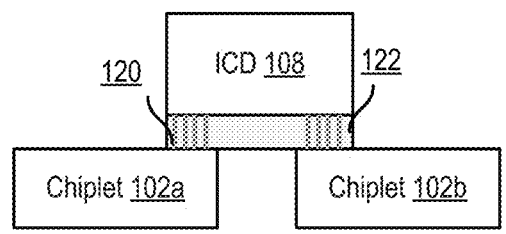
FIG. 1C is a diagram of an example stage of a hybrid bond for hybrid bonded interconnect bridging according to some embodiments.

For example, as seen in FIG. 1B, both the chiplets 102a,b and the interconnecting die 108 include metal interconnects 120 (e.g., copper interconnects) as connection points for input/output pathways. The metal interconnects 120 of the interconnecting die 108 and a chiplet 102a,b are aligned. A dielectric bond (e.g., oxide bond) is formed between the interconnecting die 108 and the chiplet 102a,b by applying the dielectric substance 122 between the two components. When heat is applied, the metal interconnects of the interconnecting die 108a and chiplet 102a,b expand. As shown in FIG. 1C, as the metal interconnects 120 of the interconnecting die 108a and chiplet 102a,b are aligned, their expansion causes the aligned metal interconnects to 120 come into contact and bond, thereby forming the metal interconnect 120 bond of the hybrid bond. Thus, a bond is formed by the dielectric substance 120 and the expanded and bonded metal interconnects 122.

The use of the hybrid bond allows for finer connection pitches between the interconnecting die 108 and the chiplets 102a,b. For example, the hybrid bond provides for connection pitches less than 10 micrometers. In some embodiments, the chiplets 102a,b include connection areas of varying pitch densities. For example, a portion of a surface of a chiplet 102a,b includes a finer pitch connection area for connecting the interconnecting die 108 and another portion of a greater pitch connection area (e.g., for connecting conductive pillars 110 as are described below). The use of the finer pitch interconnects available through hybrid bonding allows for improved signal quality between chiplets 102a,b, improved power efficiency, and overall improved performance.

In some embodiments, such as where power needs to be transferred though the interconnecting die 108, the interconnecting die 108 includes additional power connections. For example, where the connections between the interconnecting die 108 and chiplets 108a,b described above are insufficient for transferring required amounts of power, dedicated power connections are also used. The additional power connects allow for power to be transferred between the chiplets 102a,b and conductive pillars 110 of the chip. For example, in some embodiments, the interconnecting die 108 includes trans-silicon vias (TSVs) for the dedicated power connections. In some embodiments, the interconnecting die 108 includes additional connections to allow for communications external to the interconnecting die 108, facilitating communications to those components not directly bonded or communicatively coupled with the interconnecting die 108 (e.g., other than the directly bonded chiplets 102a,b). For example, the interconnecting die 108 includes one or more ultra-short reach (USR) connections, one or more serializer/deserializer (SerDes) connections, or other connection points for signal pathways to components not directly bonded to the interconnecting die 108.

The chip 100 also includes one or more conductive pillars 110. The conductive pillars 110 provide a conductive pathway to the chiplets 102a,b or the interconnecting die 108. The conductive pillars 110 are composed of a conductive metal such as copper, or another conductive metal. The conductive pillars 110 are deposited in a layer of molding 112. The molding 112 includes epoxy or another material.

Conductive bumps 114 are applied to the conductive pillars 110. The conductive bumps 114 provide solderable connection points to the surface of the chip 100. Thus, the conductive bumps 114 and conductive pillars 110 provide a conductive pathway from the surface of the chip 100 to the chiplets 102a,b and the interconnecting die 108. For example, the conductive bumps 114 include copper, a tin-silver alloy, or another conductive material suitable for solderable connections. A layer of polyimide 116 is applied to the surface of the chip 100 opposite the wafer 104 and including the conductive bumps 114. In some embodiments, conductive traces (e.g., copper traces) are etched or otherwise included in the polyimide 116 layer.

The chip 100 is described as including conductive pillars 110 in a layer of epoxy molding 112 to provide a conductive pathway to the chiplets 102a,b and the interconnecting die 108. However, in an alternative embodiment, the chip 100 includes a fluorosilicate glass (FSG) dielectric layer (or another suitable dielectric layer) instead of the layer of epoxy molding 112. One or more through-dielectric vias are used instead of the conductive pillars 110 to provide a conductive pathway to the chiplets 102a,b and the interconnecting die 108.

FIGS. 2A-2D show an example process flow for fabricating a chip (e.g., the chip 100) for hybrid bonded interconnect bridging according to various embodiments. Beginning with FIG. 2A, at step 210, chiplets 202a, 202b, 202c, and 202d are reconstituted on a carrier 204. At step 215, the chiplets 202a-d are ground to reduce their overall height to a desired height (e.g., micrometers, or another height). At step 220, a deposition 222 layer is applied over the chiplets. The deposition 222 layer includes, for example, an oxide/nitride deposition 222. At step 225, chemical-mechanical polishing (e.g., planarization) is used to remove portions of the deposition 222 to be approximately planarly level with the chiplets 202a-d.

Figure 2A:
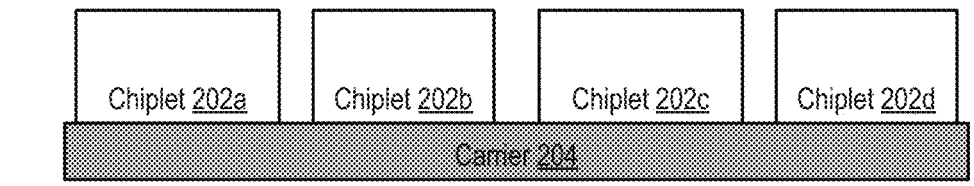
FIG. 2A is a portion of an example process flow for constructing a chip for hybrid bonded interconnect bridging according to some embodiments.
Figure 2A:
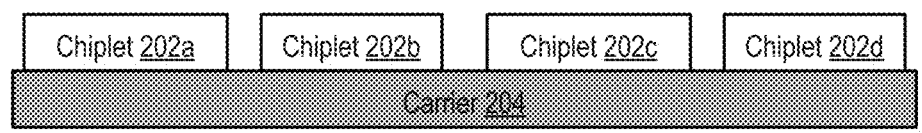
Figure 2A:
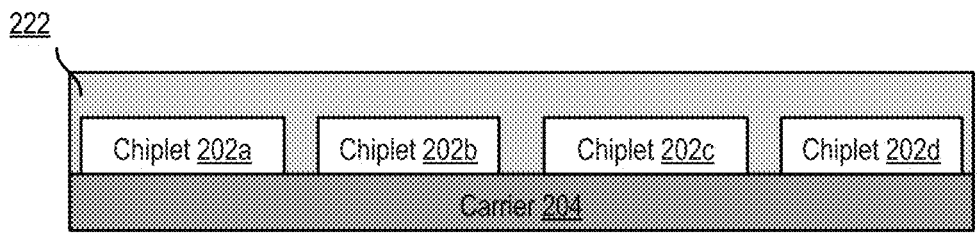
Figure 2A:
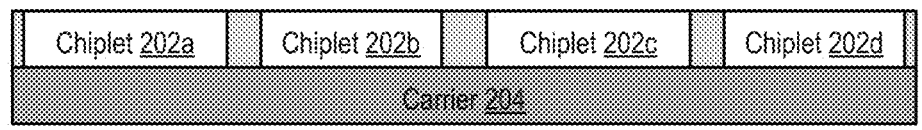
Figure 2B:
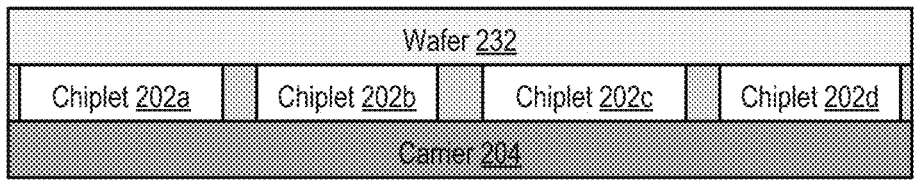
FIG. 2B is a portion of an example process flow for constructing a chip for hybrid bonded interconnect bridging according to some embodiments.
Figure 2B:
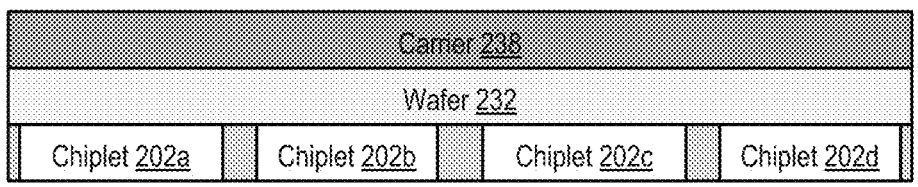
Figure 2B:
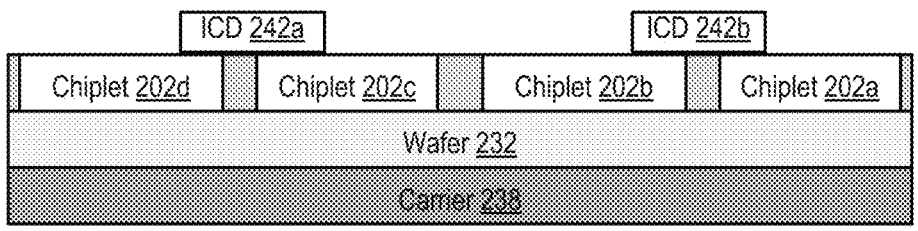
Figure 2B:
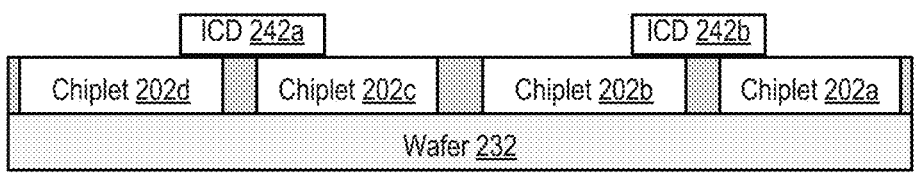

Moving to FIG. 2B, at step 230, a wafer 232 is bonded to the chiplets 202a-d. The wafer 232 includes, for example, a dummy silicon wafer 232. In some embodiments, the wafer 232 is bonded to the chiplets 202a-d using a hybrid bond (e.g., a copper-oxide bond, or another hybrid bond) or an oxide bond. At step 235, the carrier 204 is removed and a carrier 238 is bonded to the wafer 232. It is understood that, in some embodiments, after the carrier 204 is removed no carrier 238 is bonded to the wafer 232 and the fabrication process continues without a carrier 238. At step 240, the view the of the chip has been rotated 180 degrees such that the carrier 238 is now on the bottom of the view. An interconnecting die 242a is bonded to chiplets 202d and 202c, and an interconnecting die 242b is bonded to chiplets 202b and 202a. The interconnecting dies 242a,b are bonded to their respective chiplets 202a-d using a hybrid bond (e.g., a copper-oxide bond). In some embodiments, the interconnecting dies 242a,b are bonded to their respective chiplets 202a-d onto areas of finer connection pitches relative to the remainder of the chiplet 202a-d. At step 245, where present, the carrier 238 is removed. A sputtering seed layer (not shown) is applied to the substrate (e.g., over the chiplets 202a-d and interconnecting dies 242a,b).

Figure 2C:
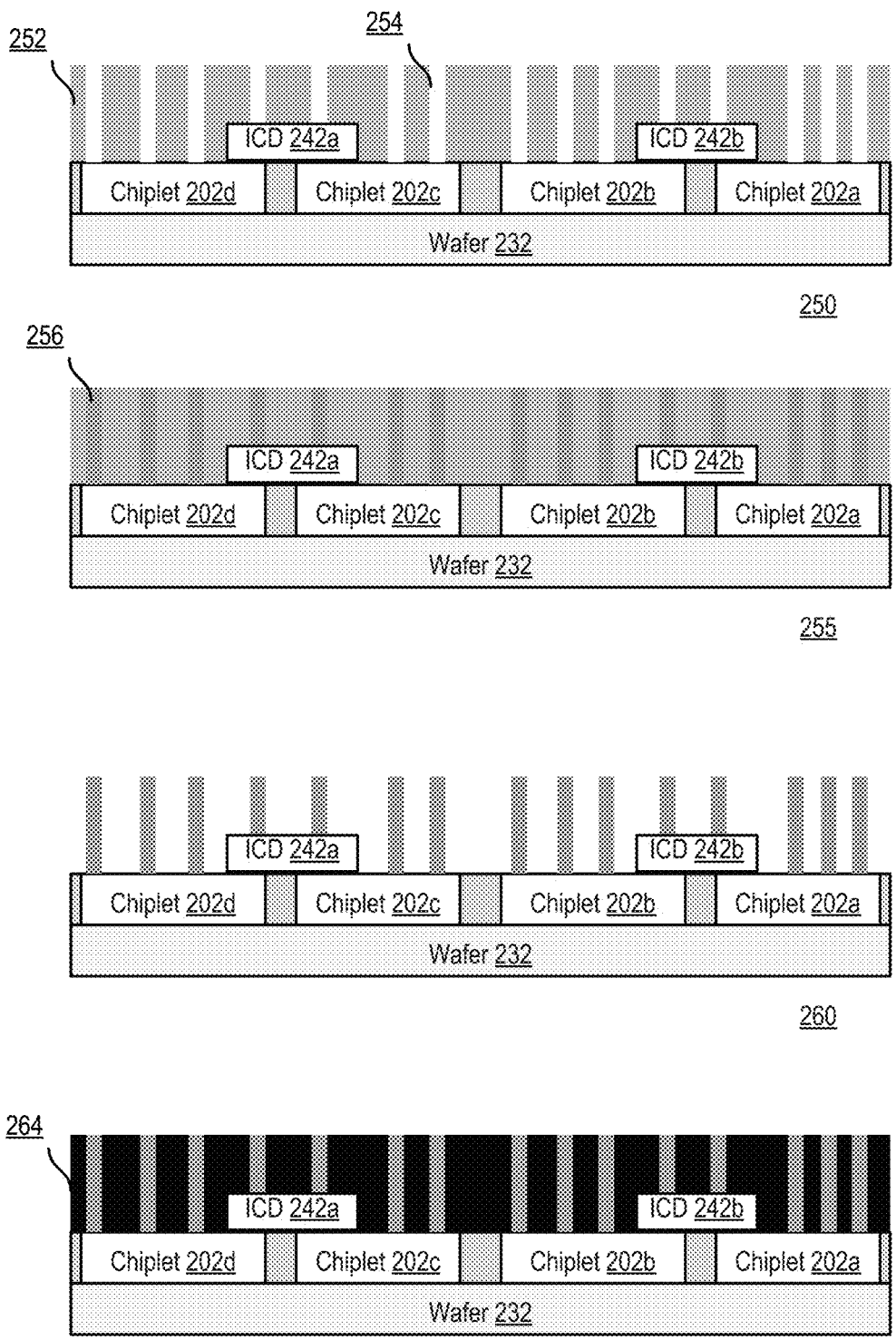
FIG. 2C is a portion of an example process flow for constructing a chip for hybrid bonded interconnect bridging according to some embodiments.

Continuing with FIG. 2C, at step 250 a photoresist 252 layer (e.g., a photoresist strip) is applied to the substrate. The photoresist 252 layer includes openings 254 to allow, at step 255, the insertion of conductive pillars 256. The photoresist 252 layer and the sputtering seed are removed from the substrate at step 260 and a layer of molding 264 (e.g., epoxy) is applied at step 265.

Figure 2D:
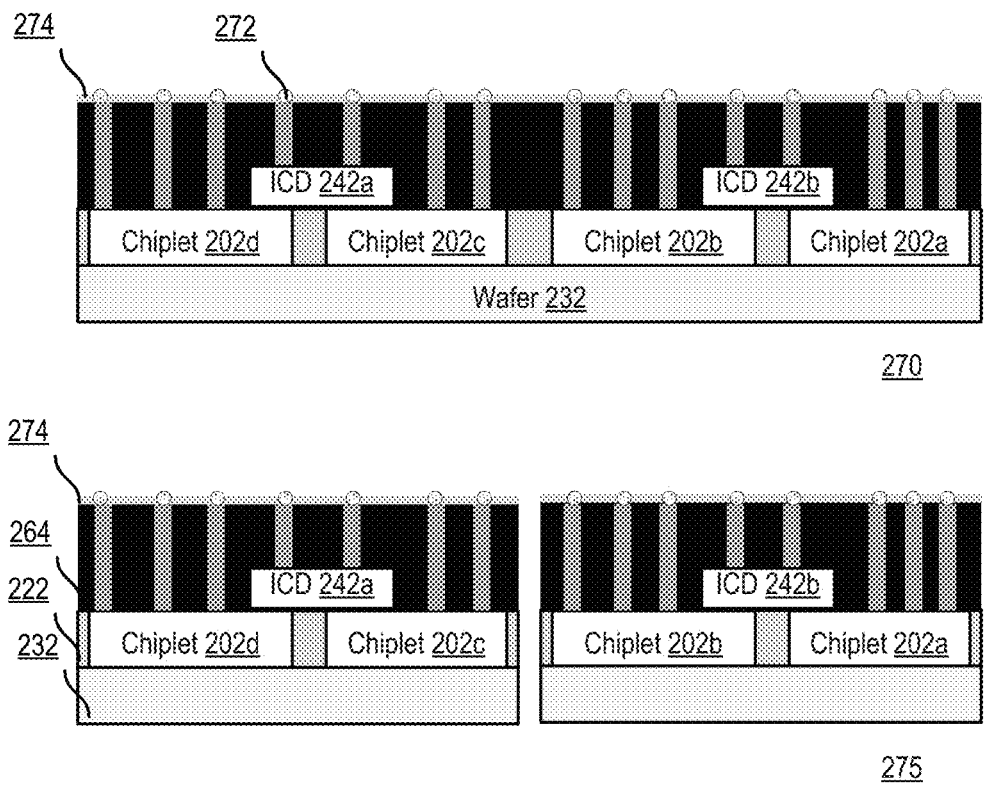
FIG. 2D is a portion of an example process flow for constructing a chip for hybrid bonded interconnect bridging according to some embodiments.

Moving to FIG. 2D, at step 270, conductive bumps 272 are applied to the conductive pillars 256. A polyimide 274 layer is applied on the molding 264. At step 275, the structure is separated (e.g., diced) though the polyimide 274, molding 264, deposition 222, and wafer 232 to create separate chips. Although the fabrication process shown in FIGS. 2A-2D is shown to create two chips of two chiplets bonded by an interconnecting die using a hybrid bond, it is understood that, in other embodiments, additional combinations of chiplets and interconnecting dies are be used in each resulting chip. For example, multiple chiplets are interconnected using multiple interconnecting dies bonding pairs of chiplets using hybrid bonds. Moreover, it is understood that fewer or additional chips may be fabricated at a time as part of the fabrication process.

Figure 3:
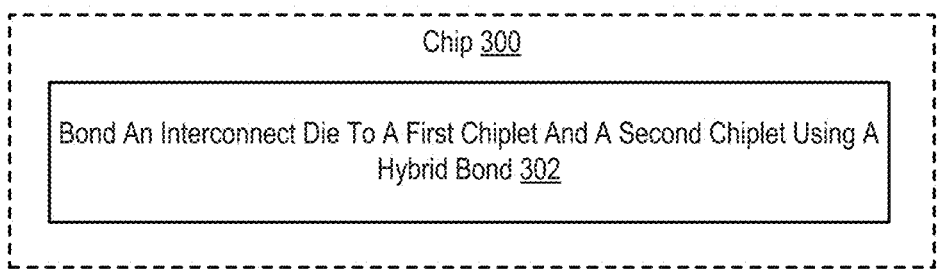
FIG. 3 is a flowchart of an example method for hybrid bonded interconnect bridging according to some embodiments.

For further explanation, FIG. 3 sets forth a flow chart illustrating an exemplary method for hybrid bonded interconnect bridging that includes bonding 302 (e.g., for a chip 300) an interconnecting die 108 to a first chiplet 102a and a second chiplet 102b using a hybrid bond. Each of the chiplets 102a,b is a functional circuit block designed to integrate with other chiplets 102a,b. Each chiplet 102a,b includes, for example, a silicon die. Interconnecting dies 108 are silicon dies that provide a connective coupling between two chiplets. In other words, a connection path between two chiplets is formed using the interconnecting dies and interconnects between the layers of the formed chip 100. A hybrid bond is an alternative to thermocompression bonding that combines metal interconnects with some other form of bond. Examples of metal interconnects in the hybrid bond include copper, indium, and silver. As an example, the hybrid bond includes a copper bond and an oxide bond (e.g., a copper-oxide bond).

The use of the hybrid bond allows for finer connection pitches between the interconnecting die 108 and the chiplets 102a,b. For example, the hybrid bond provides for connection pitches less than 10 micrometers. In some embodiments, the chiplets 102a,b include connection areas of varying pitch densities. For example, a portion of a surface of a chiplet 102a,b includes a finer pitch connection area for connecting the interconnecting die 108 and another portion of a greater pitch connection area. The use of the finer pitch interconnects available through hybrid bonding allows for improved signal quality between chiplets 102a,b, improved power efficiency, and overall improved performance.

In some embodiments, such as where power needs to be transferred though the interconnecting die 108, the interconnecting die 108 includes additional power connections. The additional power connects allow for power to be transferred between the chiplets 102a,b and conductive pillars 110 of the chip. For example, in some embodiments, the interconnecting die 108 includes trans-silicon vias (TSVs). In some embodiments, the interconnecting die 108 includes physical connections to allow for communications external to the interconnecting die 108. For example, the interconnecting die 108 includes one or more ultra-short reach (USR) connections or one or more serializer/deserializer (SerDes) connections.

Figure 4:
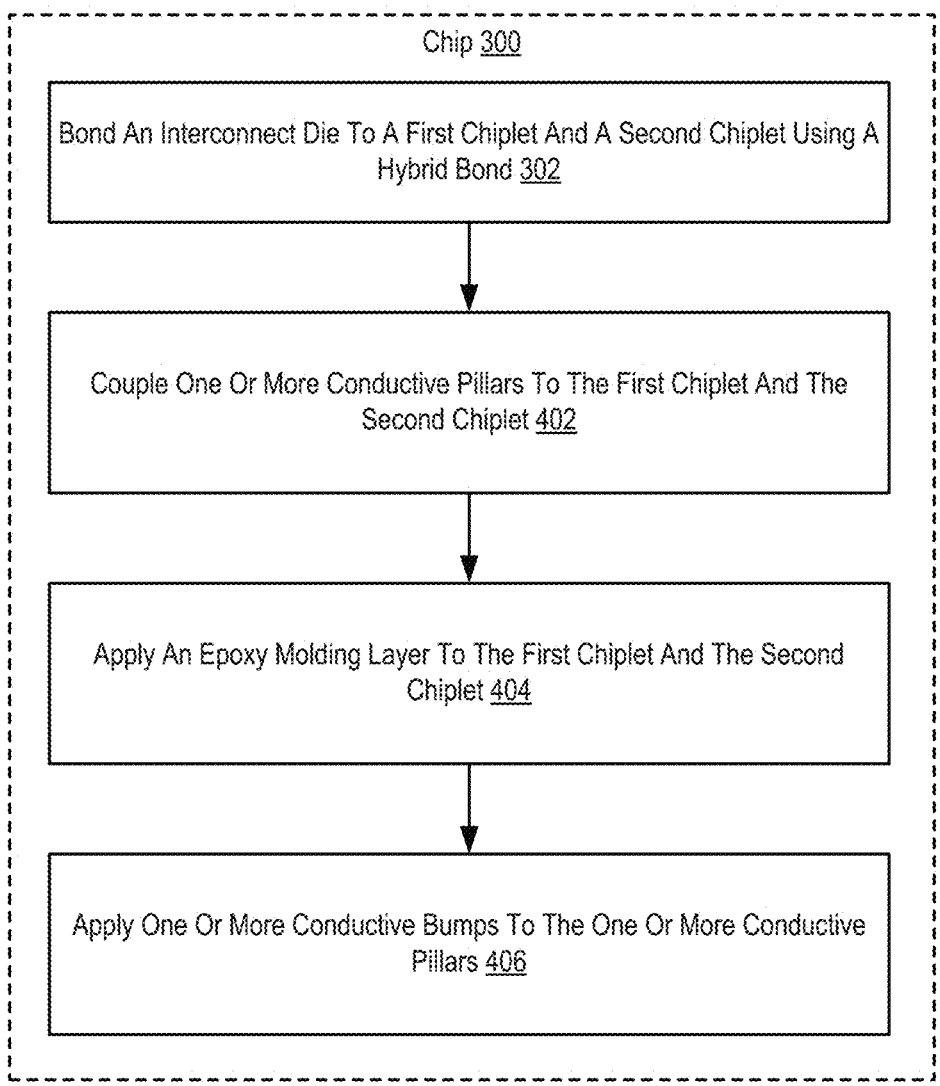
FIG. 4 is a flowchart of an example method for hybrid bonded interconnect bridging according to some embodiments.

For further explanation, FIG. 4 sets forth a flow chart illustrating an exemplary method for hybrid bonded interconnect bridging that includes bonding 302 (e.g., for a chip 300) an interconnecting die 108 to a first chiplet 102a and a second chiplet 102b using a hybrid bond. The method of FIG. 4 differs from FIG. 3 in that the method of FIG. 4 includes coupling 402 one or more conductive pillars 110 to the first chiplet 102a and the second chiplet 102b. The one or more conductive pillars 110 are composed of conductive metal such as copper or another conductive metal. In some embodiments, coupling 402 the one or more conductive pillars 110 to the first chiplet 102a and the second chiplet 102b includes applying a photoresist layer (e.g., a photoresist film) over the first chiplet 102a, the second chiplet 102b, and the interconnecting die 108. The photoresist layer includes openings into which the one or more conductive pillars 110 are inserted.

The method of FIG. 4 also includes applying 404 an epoxy molding 112 layer to the first chiplet 102a and the second chiplet 102b. The epoxy molding 112 layer is applied such that the one or more conductive pillars 112 are not completely encompassed by the epoxy molding 112. For example, the epoxy molding 112 layer is applied such that, when hardened, the epoxy molding 112 layer is planar with the ends of the conductive pillars 110 not coupled to the first chiplet 102a, 102b, or the interconnecting die 108. In some embodiments, applying 404 the epoxy molding 112 layer to the first chiplet 102a and the second chiplet 102b includes removing a photoresist layer.

The method of FIG. 4 also includes applying 406 one or more conductive bumps 114 to the one or more conductive pillars 110. The one or more conductive bumps 114 are portions of conductive material that provide a solderable connection point. By applying the one or more conductive bumps 114, a solderable, conductive pathway is provided from the surface of the chip 300 to the chiplets 102a,b and the interconnecting die 108 (when conductive pillars 110 are connected) using the one or more conductive pillars 110. In some embodiments, applying 406 one or more conductive bumps 114 to the one or more conductive pillars 110 includes applying a polyimide layer 116 over the epoxy molding 112 layer.

Figure 5:
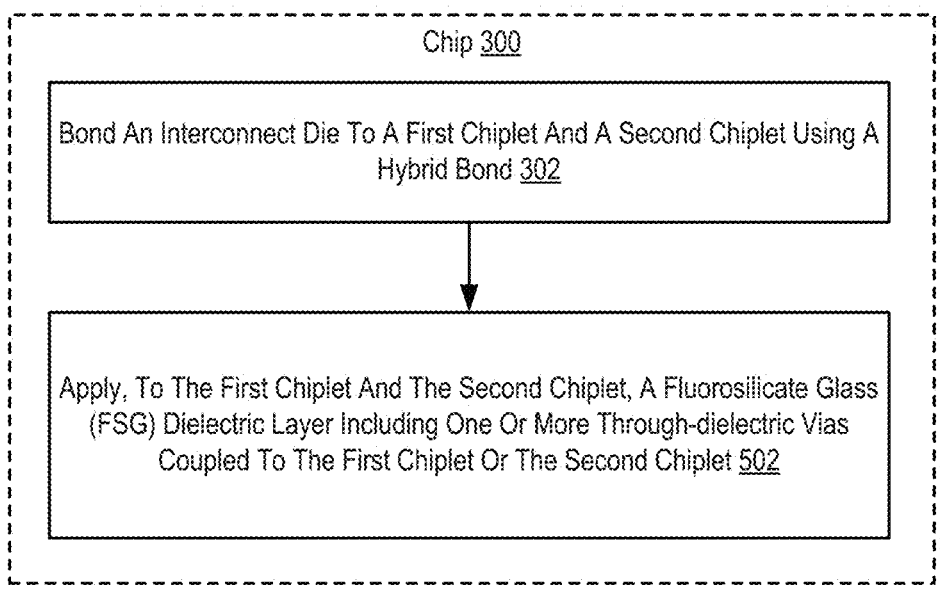
FIG. 5 is a flowchart of an example method for hybrid bonded interconnect bridging according to some embodiments.

For further explanation, FIG. 5 sets forth a flow chart illustrating an exemplary method for hybrid bonded interconnect bridging that includes bonding 302 (e.g., for a chip 300) an interconnecting die 108 to a first chiplet 102a and a second chiplet 102b using a hybrid bond. The method of FIG. 5 differs from FIG. 3 in that the method of FIG. 5 includes applying 502, to the first chiplet 102a and the second chiplet 102b, a fluorosilicate glass (FSG) dielectric layer including one or more through-dielectric vias coupled to the first chiplet 102a or the second chiplet 102b. The through-dielectric vias provide a conductive pathway from the surface of the chip 300 to the first chiplet 102a or the second chiplet 102b. In some embodiments, or more through-dielectric vias are also coupled to the interconnecting die 108, providing a conductive pathway from the surface of the chip 300 to the interconnecting die 108.

In view of the explanations set forth above, readers will recognize that the benefits of hybrid bonded interconnect bridging include:

Improved performance of a computing system by providing finer pitch connections between interconnecting dies and chiplets, providing improved power efficiency, signal quality, and performance due.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A chip comprising:
a first die including a first connection area having a first pitch density and a second connection area having a second pitch density, the first pitch density being different than the second pitch density;
a second die including a third connection area with the first pitch density; and
an interconnecting die in a stacked relation to the first die and the second die, the interconnecting die coupled to each of the first connection area of the first die and the third connection area of the second die via a metal-dielectric bond pair.

2. The chip of claim 1, wherein the first pitch density is greater than the second pitch density.

3. The chip of claim 1, wherein the first die is coupled to the interconnecting die through a first bond and a second bond.

4. The chip of claim 3, wherein the first bond comprises a metal to metal bond.

5. The chip of claim 3, wherein the second bond comprises a dielectric to dielectric bond.

6. The chip of claim 1, further comprising one or more conductive pillars coupled to the second connection area of the first die.

7. The chip of claim 6, wherein the one or more conductive pillars are coupled to one or more power connections.

8. The chip of claim 1, further comprising one or more through-dielectric vias coupled to the second connection area of the first die.

9. The chip of claim 8, wherein the interconnecting die is further coupled to a first component via one or more connections.

10. The chip of claim 9, wherein the one or more connections include one or more of an ultra-short-reach (USR) connection or a serializer/dserializer (SerDes) connection.

11. The chip of claim 1, wherein the first die and the second die each comprise a chiplet die.

12. An apparatus comprising:
one or more components, wherein at least one component is operatively coupled to a chip and the chip comprises:
a first die including a first connection area having a first pitch density and a second connection area having a second pitch density, the first pitch density being different than the second pitch density;
a second die including a third connection area with the first pitch density; and
an interconnecting die in a stacked relation to the first die and the second die, the interconnecting die coupled to each of the first connection area of the first die and the third connection area of the second die via a metal-dielectric bond pair.

13. The apparatus of claim 12, wherein the first pitch density is greater than the second pitch density.

14. The apparatus of claim 12, wherein the first die is coupled to the interconnecting die through a first bond and a second bond.

15. The apparatus of claim 14, wherein the first bond comprises a metal to metal bond.

16. The apparatus of claim 14, wherein the second bond comprises a dielectric to dielectric bond.

17. The apparatus of claim 12, further comprising one or more conductive pillars coupled to the second connection area of the first die.

18. The apparatus of claim 17, wherein the one or more conductive pillars are coupled to one or more power connections.

19. The apparatus of claim 12, further comprising one or more through-dielectric vias coupled to the second connection area of the first die.

20. The apparatus of claim 19, wherein the interconnecting die is further coupled to the at least one component via one or more connections.

* * * * *